US009641128B2

(12) United States Patent
Yang et al.

(10) Patent No.: US 9,641,128 B2
(45) Date of Patent: May 2, 2017

(54) HIGH LINEARITY STRUCTURE FOR AMPLIFIER

(71) Applicant: QUALCOMM Incorporated, San Diego, CA (US)

(72) Inventors: Chien-Chung Yang, San Diego, CA (US); Vijayakumar Dhanasekaran, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 14/812,867

(22) Filed: Jul. 29, 2015

(65) Prior Publication Data

US 2017/0033744 A1    Feb. 2, 2017

(51) Int. Cl.
H03G 3/30 (2006.01)
H03F 1/02 (2006.01)
H03F 3/185 (2006.01)
H03F 3/21 (2006.01)
H03F 3/217 (2006.01)

(52) U.S. Cl.
CPC ........... *H03F 1/0205* (2013.01); *H03F 3/185* (2013.01); *H03F 3/211* (2013.01); *H03F 3/2171* (2013.01); *H03F 2200/03* (2013.01); *H03F 2200/294* (2013.01); *H03F 2203/21106* (2013.01)

(58) Field of Classification Search
CPC ....................................................... H03G 3/30
USPC .................................................. 330/51, 279
See application file for complete search history.

(56) References Cited

U.S. PATENT DOCUMENTS

| 5,963,085 | A | 10/1999 | Sauer |
| 7,414,804 | B1* | 8/2008 | Voo ........................ G11B 5/02 330/62 |
| 7,679,402 | B2 | 3/2010 | Butts et al. |
| 8,717,097 | B2 | 5/2014 | Dhanasekaran |
| 2008/0231368 | A1* | 9/2008 | Suzaki ..................... H03F 1/30 330/277 |
| 2009/0195305 | A1 | 8/2009 | Ballarin et al. |
| 2010/0156521 | A1 | 6/2010 | Stultz et al. |
| 2010/0225379 | A1 | 9/2010 | Ramet |
| 2011/0043286 | A1 | 2/2011 | Youngblood |
| 2012/0146719 | A1 | 6/2012 | Mehr et al. |
| 2012/0286845 | A1 | 11/2012 | Morra |
| 2013/0069719 | A1* | 3/2013 | Niederberger ........... H03F 1/26 330/75 |
| 2013/0169365 | A1* | 7/2013 | Lee ...................... H03G 1/0082 330/282 |
| 2014/0225673 | A1 | 8/2014 | Jordan |
| 2014/0355790 | A1 | 12/2014 | Panov et al. |

FOREIGN PATENT DOCUMENTS

EP    2317644 A1    5/2011

OTHER PUBLICATIONS

Chen, Jianlong et al., "A 62mW Stereo Class-G Headphone Driver with 108dB Dynamic Range and 600uA/Channel Quiescent Current," IEEE International Solid-State Circuits Conference, 2013, 3 Pages.
International Search Report and Written Opinion—PCT/US2016/042111—ISA/EPO—Oct. 19, 2016, 14 pages.

* cited by examiner

*Primary Examiner* — Henry Choe
(74) *Attorney, Agent, or Firm* — Toler Law Group, PC

(57) ABSTRACT

An apparatus includes an input amplifier stage and a switch that has a first terminal at a virtual ground input of the input amplifier stage.

19 Claims, 6 Drawing Sheets

HIGH LINEARITY STRUCTURE FOR AMPLIFIER

I. FIELD

The present disclosure is generally related to electronics, and more specifically to amplifiers.

II. DESCRIPTION OF RELATED ART

Conventional audio amplifiers may exhibit click-and-pop "CnP" noise during startup and shutdown. To reduce CnP noise, an audio amplifier (e.g., a headphone amplifier) may include a main amplifier stage that is coupled to an audio output port and an auxiliary amplifier stage that is selectively isolated from the audio output port.

During startup, the main amplifier stage is disabled and the auxiliary amplifier stage is enabled. The auxiliary amplifier stage is at least partially isolated from the audio output port to reduce or eliminate CnP noise at the audio output port. After startup is complete, the main amplifier stage is enabled and the auxiliary amplifier stage is disabled.

However, switching devices ("CnP switches") that are used to enable or disable feedback paths of the main amplifier stage and the auxiliary amplifier stage during amplifier startup also introduce distortion during normal operation due to non-linearity of the CnP switches. Such distortion may be partially suppressed by using very large CnP switches. However, CnP switches that are large enough to enable the audio amplifiers to achieve total harmonic distortion (THD) values of less than −110 decibels (dB) also introduce other adverse performance effects, such as impacting phase margin, gain margin, intermodulation distortion (IMD), etc. in addition to increasing size and cost of the audio amplifiers.

III. BRIEF DESCRIPTION OF THE DRAWINGS

IV. DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Figure 1:
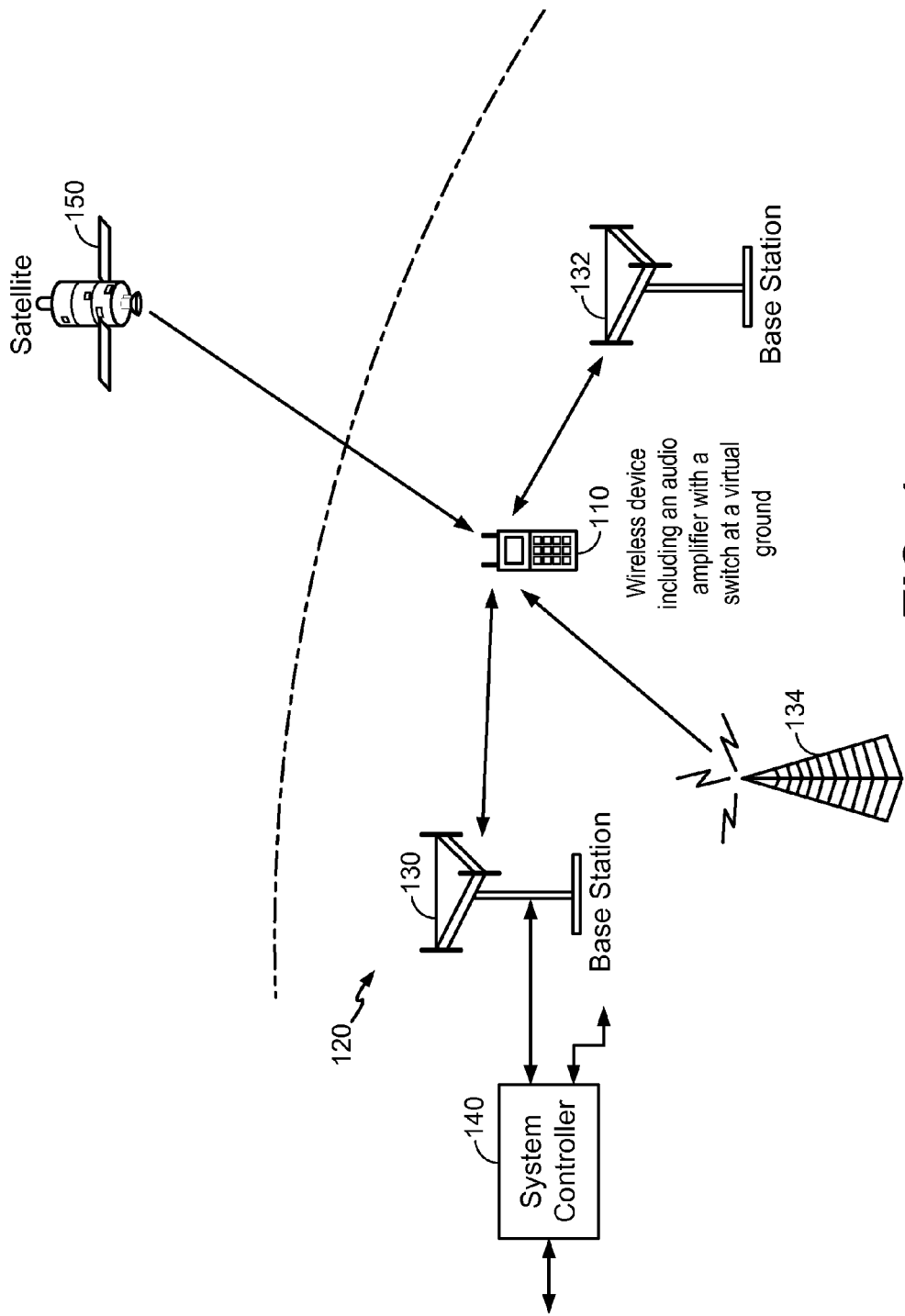
FIG. 1 shows a wireless device that includes an audio amplifier with a switch at a virtual ground communicating with a wireless system.

FIG. 1 shows a wireless device 110 communicating with a wireless communication system 120. Wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1×, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless system 120 may include any number of base stations and any set of network entities.

Wireless device 110 may also be referred to as user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1×, EVDO, TD-SCDMA, GSM, 802.11, etc.

In an exemplary embodiment, the wireless device 110 may include an audio amplifier, such as a headphone amplifier. The audio amplifier includes a high-linearity structure, such as a switch at a "virtual ground" input of the audio amplifier. As used here, a "virtual ground" is a node that is maintained at a steady reference potential ("ground"), without being connected directly to a supply (e.g., a ground terminal or a voltage supply) of the reference potential. The virtual ground input of the audio amplifier is an input node that is coupled to a feedback path of the audio amplifier to maintain (or substantially maintain) a constant voltage at the input node without the input node being connected to a voltage supply or ground terminal. The switch may be a CnP switch on a feedback path of the audio amplifier. The high linearity of the switch results from using a switch control signal that tracks an output of the audio amplifier. By controlling the switch using the control signal that tracks the amplifier output, non-linear current-voltage behavior of the switch may be reduced or eliminated, resulting in reduced distortion of the audio amplifier, as described in further detail with respect to FIGS. 2-7.

Figure 2:
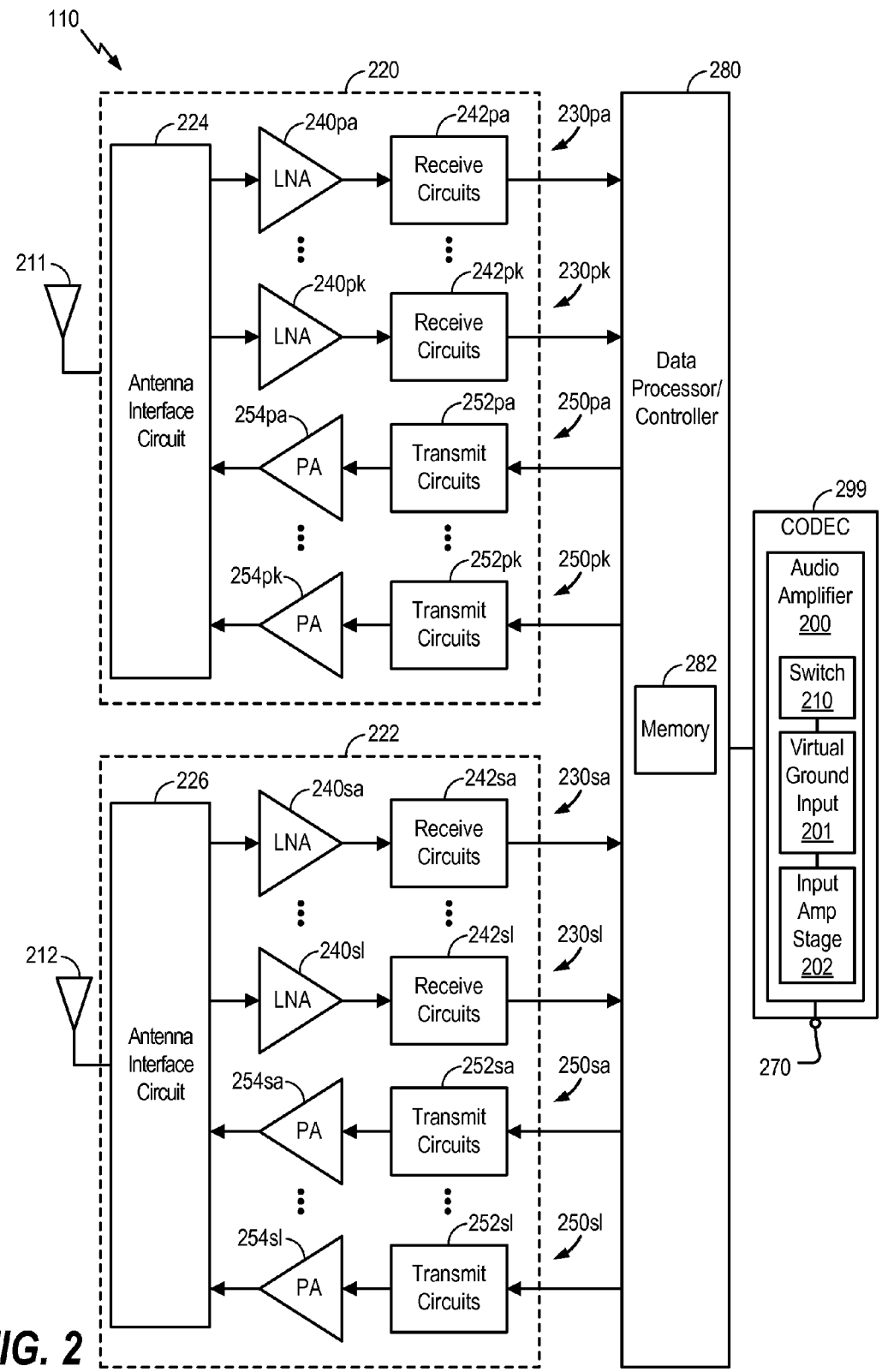
FIG. 2 shows a block diagram of the wireless device in FIG. 1 that includes an audio amplifier with a switch at a virtual ground.

FIG. 2 shows a block diagram of an exemplary design of wireless device 110 in FIG. 1. In this exemplary design, wireless device 110 includes an audio amplifier 200 that includes a switch 210 coupled to a virtual ground input 201 of an input amplifier stage 202. The audio amplifier 200 is included in a coder/decoder (CODEC) 299 that is coupled to a data processor/controller 280. The wireless device 110 also includes transceiver 220 coupled to the data processor/controller 280 and a transceiver 222 coupled to the data processor/controller 280. The transceiver 220 is coupled to a primary antenna 211 via an antenna interface circuit 224, and the transceiver 222 is coupled to a secondary antenna 212 via an antenna interface circuit 226.

Transceiver 220 includes multiple (K) receivers 230*pa* to 230*pk* and multiple (K) transmitters 250*pa* to 250*pk* to support multiple frequency bands, multiple radio technologies, carrier aggregation, etc. Transceiver 222 includes multiple (L) receivers 230*sa* to 230*sl* and multiple (L) transmitters 250*sa* to 250*sl* to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230*pa* to 230*pk* and 230*sa* to 230*sl* includes one of the LNAs 240*pa* to 240*pk* or 240*sa* to 240*sl* and one of the receive circuits 242*pa* to 242*pk* or 242*sa* to 242*sl*. For data reception, antenna 211 receives signals from base stations and/or other transmitter stations and outputs a received RF signal, which is routed through the antenna interface circuit 224 and presented as an input RF signal to one or more of the receivers 230*pa* to 230*pk* and 230*sa* to 230*sl*, such as via a first input signal path to receiver 230*pa* or via a second input signal path to receiver 230*pk*. Antenna interface circuit 224 may include switches, duplexers, transmit filters, receive filters, matching circuits, etc.

The description below assumes that receiver 230*pa* is selected to receive an RF signal. The RF signal received from the antenna 211 via the antenna interface circuit 224 is sent to the LNA 240*pa*. Receive circuits 242*pa* downconvert the output RF signal that is output by the LNA 240*pa* from RF to baseband, amplify and filter the downconverted signal, and send an analog input signal to data processor/controller 280. Receive circuits 242*pa* may include mixers, filters, amplifiers, matching circuits, an oscillator, a local oscillator (LO) generator, a phase locked loop (PLL), etc. Each of the receivers 230*pa* to 230*pk* and 230*sa* to 230*sl* in transceivers 220 and 222 may operate in a similar manner as receiver 230*pa*.

In the exemplary design shown in FIG. 2, each of the transmitters 250*pa* to 250*pk* and 250*sa* to 250*sl* includes one of the transmit circuits 252*pa* to 252*pk* and 252*sa* to 252*sl* and one of the power amplifiers (PAs) 254*pa* to 254*pk* and 254*sa* to 254*sl*. For data transmission, data processor/controller 280 processes (e.g., encodes and modulates) data to be transmitted and sends an analog output signal to a selected transmitter. The description below assumes that transmitter 250*pa* is the selected transmitter. Within transmitter 250*pa*, transmit circuits 252*pa* amplify, filter, and upconvert the analog output signal from baseband to RF to generate a modulated RF signal. Transmit circuits 252*pa* may include amplifiers, filters, mixers, matching circuits, an oscillator, an LO generator, a PLL, etc. A PA 254*pa* receives and amplifies the modulated RF signal and sends a transmit RF signal having the proper output power level. The transmit RF signal is routed through antenna interface circuit 224 and transmitted via antenna 211. Each of the transmitters 250*pa* to 250*pk* and 250*sa* to 250*sl* in transceivers 220 and 222 may operate in a similar manner as transmitter 250*pa*.

FIG. 2 shows an exemplary design of receivers 230*pa* to 230*pk* and 230*sa* to 230*sl* and transmitters 250*pa* to 250*pk* and 250*sa* to 250*sl*. A receiver and a transmitter may also include other circuits not shown in FIG. 2, such as filters, matching circuits, etc. All or a portion of transceivers 220 and 222 may be implemented on one or more analog integrated circuits (ICs), RF ICs (RFICs), mixed-signal ICs, etc. For example, LNAs 240*pa* to 240*pk* and 240*sa* to 240*sl* and receive circuits 242*pa* to 242*pk* and 242*sa* to 242*sl* may be implemented on one module, which may be an RFIC, etc.

Data processor/controller 280 may perform various functions for wireless device 110. For example, data processor/controller 280 may perform processing for data being received via receivers 230*pa* to 230*pk* and 230*sa* to 230*sl* and data being transmitted via transmitters 250*pa* to 250*pk* and 250*sa* to 250*sl*. Data processor/controller 280 may control the operation of the various circuits within transceivers 220 and 222. A memory 282 may store program codes and data for data processor/controller 280. Data processor/controller 280 may be implemented on one or more application specific integrated circuits (ASICs) and/or other ICs.

The CODEC 299 is coupled to the data processor/controller 280 and the CODEC 299 includes the audio amplifier 200 (e.g., a headphone amplifier) having an output port 270. The CODEC 299 may be configured to receive a digital audio signal from the data processor/controller 280 and to convert the digital audio signal into an analog audio signal. For example, the digital audio signal may correspond to voice data that is received via one or more of the antennas 211-212 and/or music data from an audio file that is processed by the data processor/controller 280. The analog audio signal may be output to the audio amplifier 200 to power headphones that are coupled to the output port 270. The audio amplifier 200 includes the switch 210 (e.g., a high-linearity structure) coupled to the virtual ground input 201 of the input amplifier stage 202. Although a single input amplifier stage 202 of the audio amplifier 200 is illustrated, the audio amplifier 200 may include multiple amplifier stages, such as described in further detail with reference to FIGS. 3-4. The switch 210 may be controlled using a control signal that tracks the output of the audio amplifier 200 to reduce or eliminate non-linear current-voltage behavior of the switch 210, resulting in reduced distortion of the audio amplifier 200, as described in further detail with respect to FIGS. 3-7.

Figure 3:
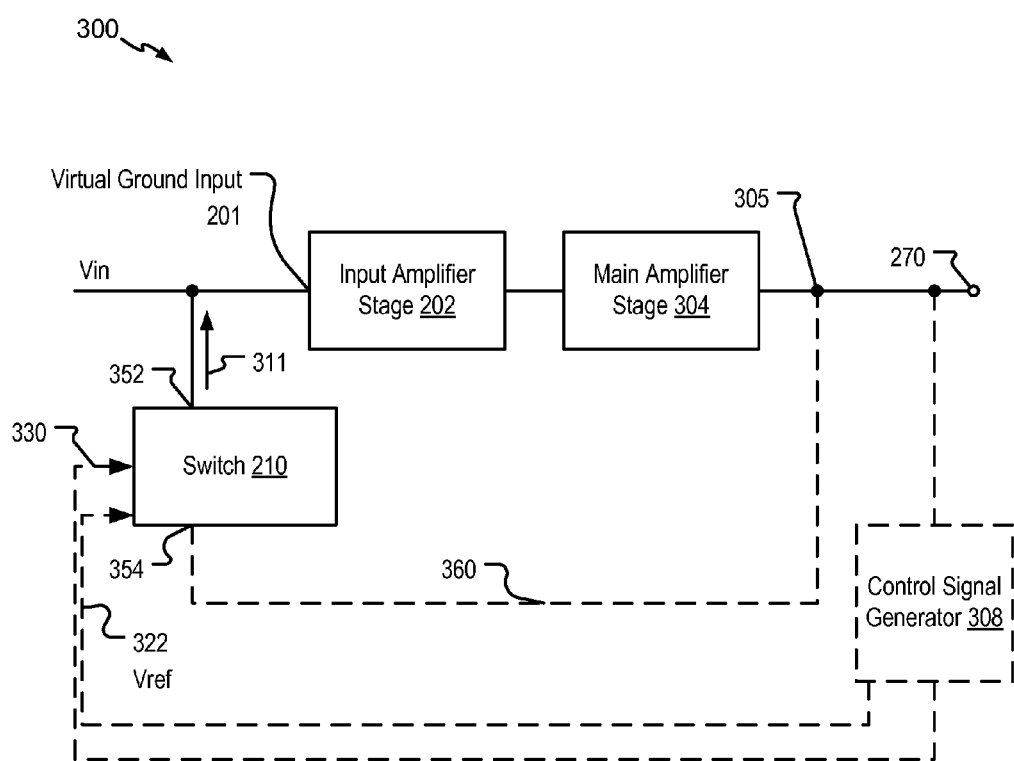
FIG. 3 shows a block diagram of an exemplary embodiment of components including a high-linearity structure for an amplifier that may be included in the wireless device of FIG. 1.

FIG. 3 illustrates an exemplary embodiment of an audio amplifier 300, such as the audio amplifier 200 of the wireless device 110 of FIGS. 1-2. The audio amplifier 300 includes the input amplifier stage 202 of FIG. 2 that is responsive to an input signal (Vin) at the virtual ground input 201. The input amplifier stage 202 provides an output to a main amplifier stage 304, and the main amplifier stage 304 provides an output to the output port 270.

A feedback path 360 may couple an output 305 of the main amplifier stage 304 to the virtual ground input 201 via a high-linearity structure, such as the switch 210 (e.g., a CnP switch). The first feedback path 360 is selectively enabled or disabled by turning the switch 210 ON or OFF. The switch 210 may be configured to output a first feedback current 311 via a first terminal 352 of the switch 210 to the virtual ground input 201 based on a control signal 330. The first feedback current 311 is responsive to the output 305 of the main amplifier stage 304 to at least partially offset voltage variations of Vin to hold the virtual ground input 201 at a substantially constant voltage. For example, the input amplifier stage 202 may include a differential amplifier having an inverting input and a non-inverting input. The non-inverting input may be coupled to a reference voltage source (e.g., a ground terminal), and the inverting input may correspond to the virtual ground input 201. The feedback current 311 is responsive to an amplified version of Vin and substantially maintains the inverting input at the same reference voltage as the non-inverting input (i.e., a virtual ground). The control signal 330 may be generated by a control signal generator 308 that is coupled to the output 305 of the main amplifier stage 304. The output 305 of the main amplifier stage 304 is coupled to an output port 270.

The control signal generator 308 may be configured to generate the first control voltage 330 to have a value that tracks a voltage at a second terminal 354 of the switch 210. For example, as explained in further detail with respect to FIG. 4, the control signal generator 308 may add a direct current (DC) voltage offset to an output of a voltage divider that is coupled to the output port 270. Because the control signal 330 tracks the voltage at the second terminal 354, a linearity of the switch 210 may be improved. The switch 210 may include a transistor that provides a current responsive to a voltage difference between the second terminal 354 and the control signal 330, as described in further detail with respect to FIG. 4. The control generator 308 may also be configured to generate a reference voltage (Vref) 322 that is provided to the switch 210, such as to a body terminal of the switch 210. Vref 322 may vary responsive to voltage changes at the output 305 and may further improve a linearity of the switch 210.

Increasing the linearity of the switch 210 reduces distortion of the audio amplifier 300 and allows a smaller switch 210 to be used, as compared to audio amplifiers that suppress distortion by using large CnP switches. Adverse performance effects or characteristics associated with large CnP switches in audio amplifiers, such as reduced phase margin, reduced gain margin, increased intermodulation distortion (IMD), etc., may be reduced or eliminated by using the smaller switch 210.

Figure 4:
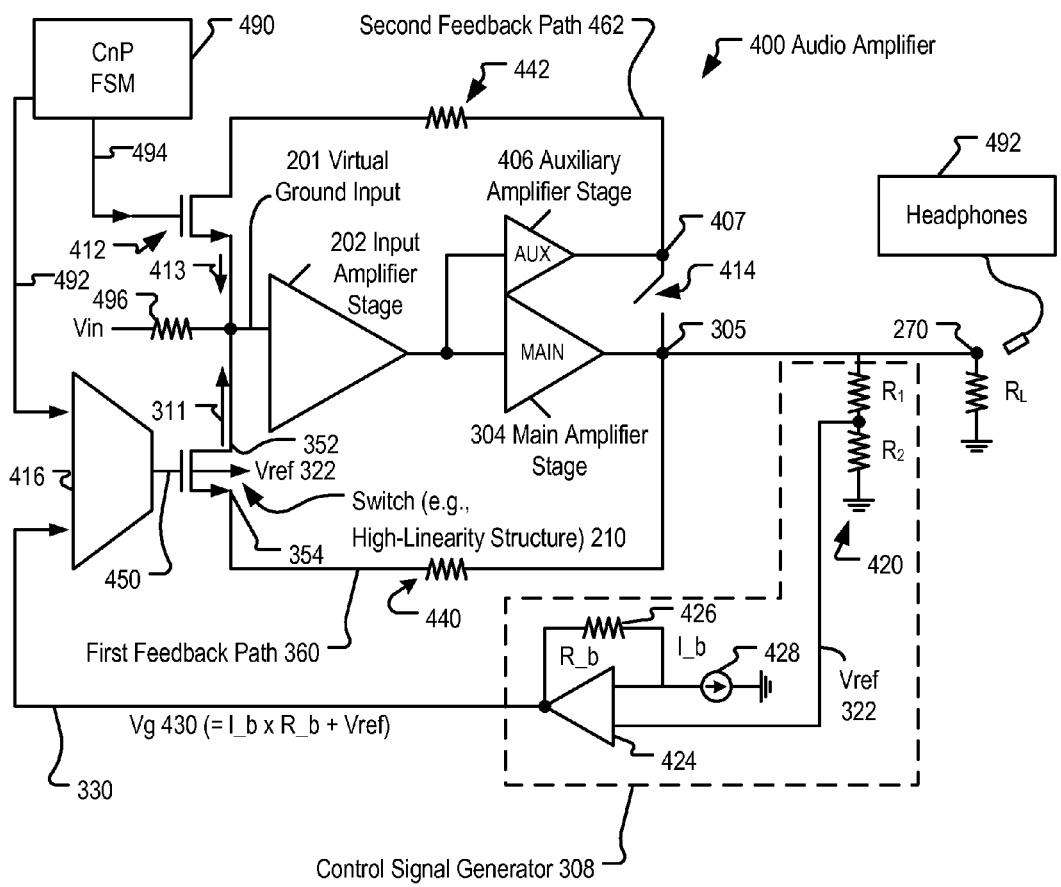
FIG. 4 shows a block diagram of another exemplary embodiment of components including a high-linearity structure for an amplifier that may be included in the wireless device of FIG. 1.

FIG. 4 illustrates an exemplary embodiments of an audio amplifier 400, such as a headphone amplifier, having the input amplifier stage 202 coupled to an input resistance 496 and to the main amplifier stage 304 of FIG. 3 and also coupled to an auxiliary amplifier stage 406. The feedback path 360 (e.g., a first feedback path) couples the output 305 of the main amplifier stage 304 to the virtual ground input 201 via a first feedback device 440 (e.g., a resistor) and the switch 210. The switch 210 is responsive to a control signal at a control terminal 450 of the switch 210. The control signal is output by a multiplexer 416 and may correspond to the control signal 330 from the control signal generator 308 or may correspond to a second control signal 492 from a control circuit 490, such as a click-and-pop finite state machine (CnP FSM). The control circuit 490 is configured to provide control signals, including a multiplexer control signal for the multiplexer 416, to startup the audio amplifier 400 by first starting up the input amplifier stage 202 and the auxiliary amplifier stage 406, followed by starting up the main amplifier stage 304 and shutting down the auxiliary amplifier stage 406, as described in further detail below.

A second feedback path 462 couples an output 407 of the auxiliary amplifier stage 406 to the virtual ground input 201 via a second feedback device 442 (e.g., a resistor) and a second switch 412. The second feedback path 462 is selectively enabled or disabled by turning the second switch 412 ON or OFF. The second switch 412 is configured to output a second feedback current 413 to the input amplifier stage 202 based on a third control signal 494 that is received from the control circuit 490. The output 305 of the main amplifier stage 304 is coupled to the output port 270, and the output 407 of the auxiliary amplifier stage 406 is selectively coupled via a third switch 414 to the output port 270.

The switch 210 has the first terminal 352 coupled to the virtual ground input 201, the second terminal 354 coupled via the first feedback device 440 to the output 305 of the main amplifier stage 304, and the control terminal 450 selectively coupled via the multiplexer 416 to the control signal generator 308. For example, the switch 210 may include a transistor, such as an n-channel metal-oxide-semiconductor field effect transistor (N-MOSFET), and the multiplexer 416 may control whether a gate voltage of the switch 210 is supplied by the control signal 330 from the control signal generator 308 (during normal operation) or by the second control signal 492 from the control circuit 490 (during startup/shutdown of the audio amplifier 400). The multiplexer 416 may select the control signal 330 or the second control signal 492 in response to a multiplexer control signal (not shown) from the control circuit 490. For example, the multiplexer 416 may select the second control signal 492 to output during startup of the audio amplifier 400 and may select the control signal 330 to output after startup of the main amplifier stage 304 has completed.

The control signal generator 308 is configured to generate the control signal 330 to have a voltage Vg 430 that tracks a voltage at the second terminal 354. For example, the reference voltage Vref 322 may be generated at a voltage divider 420 and provided at an input of an operational amplifier (opamp) 424. The voltage divider 420 may be configured so that a change in Vref 322 due to a voltage change at the output 305 substantially matches a corresponding voltage change at the second terminal 354 due to the voltage change at the output 305. A direct current (DC) voltage offset (Vdc) is added to Vref 322 at the output of the opamp 424 via a current source 428 that generates a current (I_b) through a resistor 426 that has a resistance (R_b). Vg 430 is output from the control signal generator 308 and has a value of Vdc+Vref. Because Vdc (equal to (I_b)×(R_b)) is substantially constant and Vref 322 tracks the voltage at the second terminal 354, Vg 430 also tracks the voltage at the second terminal 354, providing a substantially constant gate-to-source voltage (Vgs) at the switch 210 when the multiplexer 416 selects the control signal 330. The substantially constant Vgs results in a more linear current-voltage response of the switch 210 as compared to providing a constant supply voltage to the control terminal 450 of the switch 210 (where Vgs varies with voltage changes at the second terminal 354). In addition, a body terminal of the switch 210 may be biased with Vref 322, providing a substantially constant gate-to-body voltage (Vgb) because the control signal 330 at the gate of the switch 210 and Vref 322 at the body of the switch 210 are both responsive to voltage changes at the output 305.

During startup of the audio amplifier 400, the control circuit 490 generates control signals to enable the input amplifier stage 202 and the auxiliary amplifier stage 406, and to disable the main amplifier stage 304. The third control signal 494 closes the second switch 412 (e.g., by providing a gate voltage that exceeds a threshold voltage of the second switch 412) to enable current flow through the second feedback path 462. The multiplexer 416 is set to select the second control signal 492, the second control signal 492 opens the switch 210 (e.g., by providing a gate voltage that is less than a threshold voltage of the switch 210 to obstruct or prevent current flow through the switch 210), and the third switch 414 is opened to isolate the output port 270 from the output 407 of the auxiliary amplifier 406. Isolating the output port 270 from the output 407 reduces or eliminates startup noise (e.g., CnP noise) at the output port 270, such as audible noise at headphones 492 coupled to the output port 270.

When the control circuit 490 detects that startup of the input amplifier stage 202 and the auxiliary amplifier stage 406 has completed, the control circuit 490 may enable the main amplifier stage 304, provide a gate voltage to activate the third switch 414, and adjust the second control signal 492 to a gate voltage that exceeds a threshold voltage of the switch 210 to activate the switch 210. After the main amplifier stage 304 has started up, the second feedback path 462 may be disabled by deactivating (i.e., turning OFF) the second switch 412 and deactivating the auxiliary amplifier stage 406. The control circuit 490 may deactivate the third switch 414 to decouple the auxiliary amplifier stage 406 from the output port 270. The control circuit 490 provides a multiplexer control signal that causes the multiplexer 416 to select the output of the control signal generator 308, maintaining the switch 210 in an activated state due to a gate-to-source voltage (Vgs) (e.g., a voltage difference between the gate terminal 450 and the second terminal 354) exceeding a threshold voltage of the switch 210.

By maintaining a substantially constant Vgs and Vgb at the switch 210, the switch 210 exhibits a substantially linear current-voltage response. Increased linearity reduces distortion and allows a smaller switch 210 to be used as compared to CnP switches in audio amplifiers that suppress distortion by using large CnP switches. Adverse performance effects or characteristics associated with large CnP switches in audio amplifiers may be reduced or eliminated by using the smaller switch 210.

Figure 5:
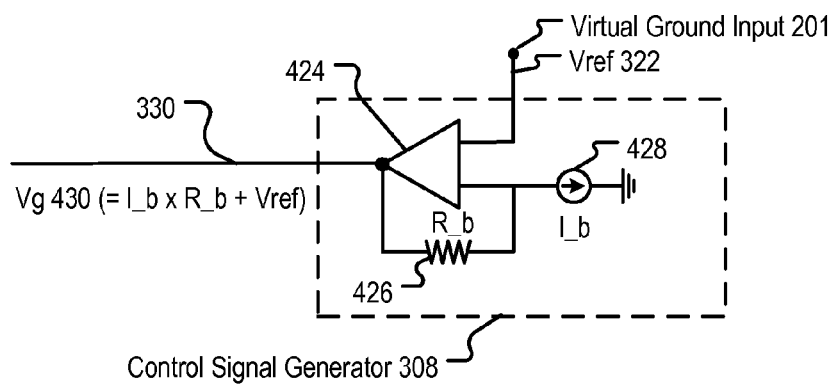
FIG. 5 shows a circuit diagram of an exemplary embodiment of a control signal generator that may be included in the wireless device of FIG. 1.

FIG. 5 depicts another exemplary embodiment 500 of the control signal generator 308 of FIG. 3 that may be included in the wireless device 110 of FIG. 1. In contrast to generating Vref 322 at the voltage divider 420 of FIG. 4 (at the output 305 of the main amplifier stage 304), the control signal generator 308 of FIG. 5 receives Vref 322 as the voltage at the virtual ground input 201. Because a voltage at the output 305 of FIG. 3 is an amplified version of the voltage at the virtual ground input 201, the voltage at the virtual ground input 201 tracks voltage changes at the output 305 and therefore also tracks voltage changes at the second terminal 354 of the switch 210 of FIG. 3.

Vref 322 from the virtual ground input 201 is provided to an input of the opamp 424. A DC voltage offset (Vdc) is added to Vref 322 at the output of the opamp 424 via the current source 428 that generates a current (I_b) through the resistor 426 (having resistance R_b). Values of the current (I_b) and/or the resistance (R_b) may differ from the corresponding values illustrated in FIG. 4 to provide a DC voltage offset (Vdc) that enables a high linearity current-voltage response of the switch 210. By using Vref 322 from the virtual ground input 201, the voltage divider 420 of FIG. 4 may be omitted, which may reduce noise and power consumption.

Figure 6:
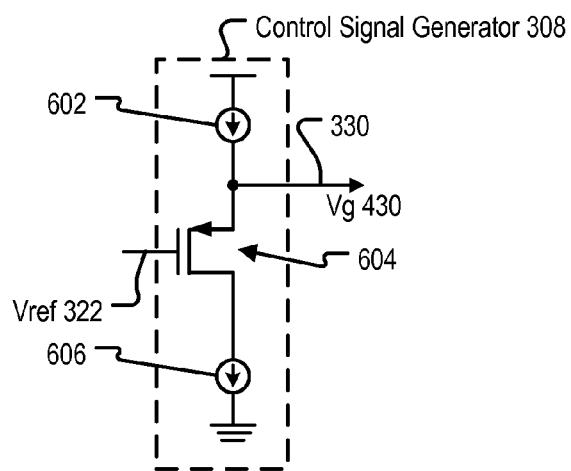
FIG. 6 shows a circuit diagram of another exemplary embodiment of a control signal generator that may be included in the wireless device of FIG. 1.

FIG. 6 depicts another exemplary embodiment 600 of the control signal generator 308 of FIG. 3 that may be included in the wireless device 110 of FIG. 1. In the exemplary embodiment 600, the control signal generator 308 may have reduced current consumption as compared to the control signal generator 308 of FIGS. 4-5. In the exemplary embodiment 600, the control signal generator 308 includes a switch 604 (e.g., a p-channel MOSFET (P-MOSFET)) that is serially coupled between a first current source 602 and a second current source 606. The switch 604 is responsive to Vref 322 at a control terminal (e.g., a gate) of the switch 604. Vref 322 may be generated by the voltage divider 420 of FIG. 4 or may correspond to the voltage at the virtual ground input 201 of FIG. 2.

The first control signal 330 having the voltage Vg 430 is provided at the source of the switch 604. Vg 430 varies in response to variations of Vref 322 while a substantially constant current flows through the switch 604. Current consumption of the control signal generator 308 of FIG. 6 may be reduced as compared to implementations of the control signal generator 308 that use the opamp 424 of FIGS. 4-5.

Figure 7:
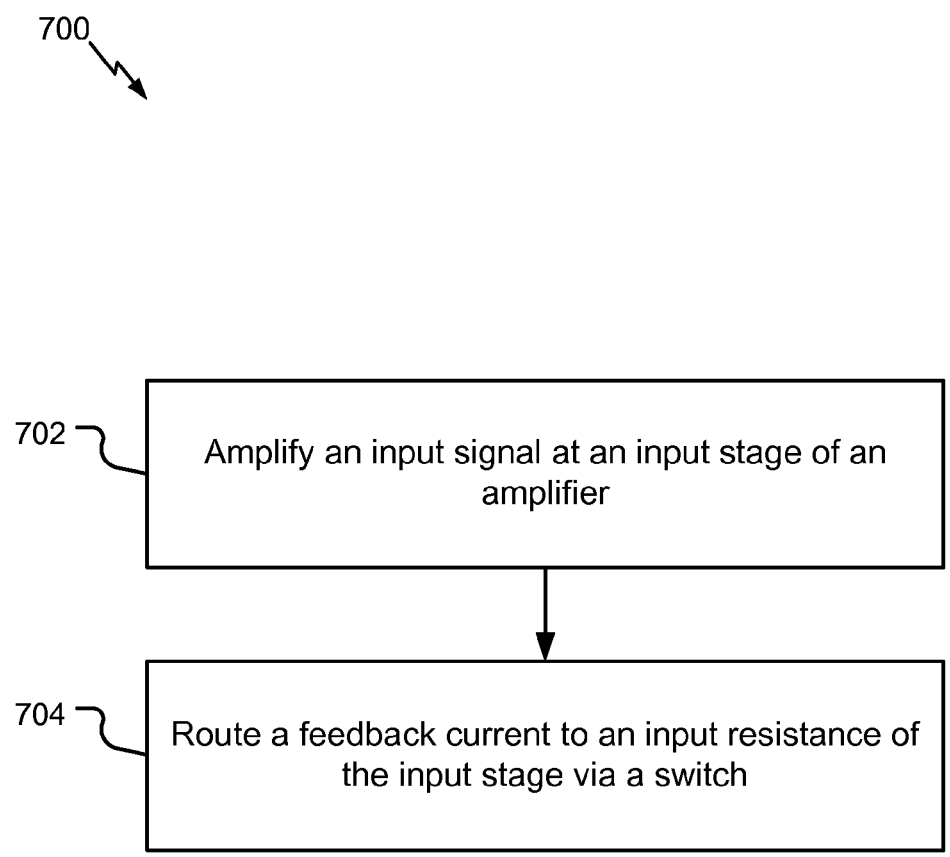
FIG. 7 illustrates a flowchart of a method that may be performed by the wireless device of FIG. 1.

An exemplary method 700 that may be performed in the wireless device 110 of FIG. 1 is shown in FIG. 7. The method 700 may include amplifying an input signal at an input stage of an amplifier, at 702. For example, after startup, the input amplifier stage 202 of FIGS. 2-4 amplifies an input signal (Vin) at the virtual ground input 201 and provides an amplified signal to the main amplifier stage 304.

The method 700 includes routing a feedback current to an input resistance of the amplifier via a switch, at 704. For example, the feedback current 311 may be routed to the input resistance 496 of the input amplifier stage 202 via the switch 210 of FIG. 4. Because the voltage Vg 430 of the first control signal 330 tracks the voltage at the second terminal 354 of the switch 210, a linearity of the switch 210 may be increased as compared to providing a constant supply voltage to the control terminal 450 of the switch 210 while the voltage at the second terminal 354 varies. Increasing the linearity of the switch 210 reduces overall distortion of the amplifier at the output port 270. A smaller switch size may be used as compared to amplifiers that use large CnP switches to reduce distortion.

In conjunction with the described embodiments, an apparatus may include means for amplifying. For example, the means for amplifying may correspond to the audio amplifier 200 of FIG. 2, the audio amplifier 300 of FIG. 3, the audio amplifier 400 of FIG. 4, one or more other devices, circuits, or any combination thereof.

The apparatus may include means for switching coupled to an input of the means for amplifying. For example, the means for switching may correspond to the switch 210 of FIGS. 2-4, one or more other devices, circuits, or any combination thereof.

The apparatus may include means for conducting feedback current from an output of the means for amplifying via the means for switching to the input of the means for amplifying. For example, the means for conducting the feedback current may correspond to the first feedback path 360 of FIGS. 3-4, one or more other conductive devices, conductive circuits, or any combination thereof.

The apparatus may include second means for amplifying coupled to the input. For example, the second means for amplifying may correspond to the input amplifier stage 202 of FIGS. 2-4, one or more other devices, circuits, or any combination thereof.

The apparatus may include third means for amplifying coupled to an output of the second means for amplifying. For example, the third means for amplifying may correspond to the main amplifier stage 304 of FIGS. 3-4, one or more other devices, circuits, or any combination thereof.

The apparatus may include fourth means for amplifying. The fourth means for amplifying may be coupled to the output of the second means for amplifying. For example, the fourth means for amplifying may correspond to the auxiliary amplifier stage 406 of FIG. 4, one or more other devices, circuits, or any combination thereof.

The apparatus may include means for conducting second feedback current from the fourth means for amplifying to the input of the means for amplifying. For example, the means for conducting the second feedback current may correspond to the second feedback path 462 of FIG. 4, one or more other conductive devices, conductive circuits, or any combination thereof. The means for conducting the second feedback current may include second means for switching coupled to the input of the means for amplifying. For example, the second means for switching may include the second switch 412 of FIG. 4, one or more other devices, circuits, or any combination thereof.

The apparatus may include means for generating a control signal that substantially tracks a reference voltage. The means for generating the control signal may be coupled to the means for conducting the feedback current. For example, the means for generating the control signal may correspond to the control signal generator 308 of FIGS. 3-6, one or more other devices, circuits, or any combination thereof. The means for generating the control signal may include fifth means for amplifying. For example, the fifth means for amplifying may correspond to the amplifier 424 of FIGS. 4-5, one or more other devices, circuits, or any combination thereof.

The means for generating the control signal may be coupled, via a means for multiplexing, to the means for switching. For example, the means for multiplexing may correspond to the multiplexor 416 of FIG. 4, one or more other devices, circuits, or any combination thereof.

The means for conducting feedback current from the output of the means for amplifying via the means for switching to the input of the means for amplifying may enable reduced overall distortion of an audio amplifier that includes the means for switching. As a result, a smaller switch size may be used as compared to amplifiers that use large CnP switches to reduce distortion.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
    an input amplifier stage;
    a switch that has a first terminal at a virtual ground input of the input amplifier stage; and
    a control signal generator coupled to a control terminal of the switch via a multiplexer and configured to generate a control voltage that substantially tracks a voltage at a second terminal of the switch, the second terminal coupled via a first feedback device to an output of a main amplifier stage.

2. The apparatus of claim 1, wherein the switch is configured to output a first feedback current to an input resistance of the input amplifier stage based on a first control signal.

3. The apparatus of claim 2, wherein a feedback path includes the switch and is coupled to the output of the main amplifier stage.

4. The apparatus of claim 3, further comprising a second feedback path that couples an output of an auxiliary amplifier stage to the virtual ground input, wherein the second feedback path includes a second switch.

5. The apparatus of claim 4, wherein the second switch is configured to output a second feedback current to the input amplifier stage based on a second control signal.

6. The apparatus of claim 1, further comprising the main amplifier stage coupled to an output of the input amplifier stage, wherein the output of the main amplifier stage is coupled to an audio output port.

7. The apparatus of claim 1, wherein a gate voltage of the switch is controlled by the multiplexer.

8. An apparatus comprising:
    means for amplifying, the means for amplifying including an input and an output;
    means for switching coupled to the input of the means for amplifying;
    means for conducting feedback current from the output of the means for amplifying via the means for switching to the input of the means for amplifying; and means for generating a control signal that substantially tracks a reference voltage, the means for generating the control signal coupled to the means for conducting the feedback current, wherein the means for generating the control signal is coupled, via a means for multiplexing, to the means for switching.

9. The apparatus of claim 8, the means for amplifying comprising:
second means for amplifying coupled to the input; and
third means for amplifying coupled to an output of the second means for amplifying.

10. The apparatus of claim 9, the means for amplifying further comprising fourth means for amplifying coupled to the output of the second means for amplifying.

11. The apparatus of claim 10, further comprising means for conducting second feedback current from the fourth means for amplifying to the input of the means for amplifying.

12. The apparatus of claim 11, the means for conducting second feedback current comprising second means for switching coupled to the input of the means for amplifying.

13. The apparatus of claim 12, the means for generating the control signal comprising fifth means for amplifying.

14. The apparatus of claim 8, further comprising the means for multiplexing, wherein the means for switching is controlled by an output of the means for multiplexing.

15. A method comprising:
amplifying an input signal at an input stage of an amplifier;
receiving, from a control signal generator at a control terminal of a switch, a control voltage that substantially tracks a voltage at a second terminal of the switch, wherein the control signal generator is coupled to the control terminal of the switch via a multiplexer; and
routing, based on the control voltage, a feedback current to an input resistance of the input stage via a first terminal of the switch.

16. The method of claim 15, further comprising controlling a gate voltage of the switch via the multiplexer, and wherein the gate voltage substantially tracks a voltage at an output of the amplifier such that a gate-to-source voltage to the switch is substantially constant.

17. The apparatus of claim 1, further comprising the multiplexer, wherein the multiplexer is configured to select a first control input during startup of the input amplifier stage.

18. The apparatus of claim 17, wherein the multiplexer is further configured to select an output of the control signal generator after the main amplifier stage has started up.

19. The method of claim 15, further comprising:
selecting a first control input during startup of the input amplifier stage; and
selecting an output of the control signal generator after a main amplifier stage has started up.

* * * * *